United States Patent
Hori et al.

(10) Patent No.: US 10,128,166 B2
(45) Date of Patent: Nov. 13, 2018

(54) POWER SEMICONDUCTOR MODULE

(71) Applicant: FUJI ELECTRIC CO., LTD., Kawasaki-shi, Kanagawa (JP)

(72) Inventors: Motohito Hori, Matsumoto (JP); Yoshikazu Takahashi, Matsumoto (JP); Eiji Mochizuki, Matsumoto (JP); Yoshitaka Nishimura, Azumino (JP); Yoshinari Ikeda, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/231,056

(22) Filed: Aug. 8, 2016

(65) Prior Publication Data

US 2016/0343641 A1    Nov. 24, 2016

Related U.S. Application Data

(63) Continuation of application No. PCT/JP2015/071203, filed on Jul. 27, 2015.

(30) Foreign Application Priority Data

Aug. 28, 2014   (JP) ................................. 2014-174629

(51) Int. Cl.
   *H01L 23/00*    (2006.01)
   *H01L 29/16*    (2006.01)
   (Continued)

(52) U.S. Cl.
   CPC ........ *H01L 23/473* (2013.01); *H01L 23/3107* (2013.01); *H01L 23/3735* (2013.01);
   (Continued)

(58) Field of Classification Search
   CPC ....... H01L 23/473; H01L 23/00; H01L 29/16; H01L 23/492; H01L 23/528
   See application file for complete search history.

(56) References Cited

U.S. PATENT DOCUMENTS

2010/0089607 A1    4/2010 Nakamura et al.
2012/0241953 A1*   9/2012 Yamada et al. ..... H01L 23/4334
                                                            257/737
(Continued)

FOREIGN PATENT DOCUMENTS

CN       101622779 A    1/2010
JP       2005-073373 A  3/2005
(Continued)

OTHER PUBLICATIONS

PCT, "International Search Report for International Application No. PCT/JP2015/071203".

(Continued)

*Primary Examiner* — Joseph C Nicely
*Assistant Examiner* — Lamont Koo
(74) *Attorney, Agent, or Firm* — Manabu Kanesaka

(57) ABSTRACT

A power semiconductor module includes a cooler; a plurality of power semiconductor units fixed on the cooler; and a bus bar unit connected electrically to the plurality of power semiconductor units. Each of the plurality of power semiconductor units includes a multilayered substrate including a circuit plate, an insulating plate, and a metal plate laminated in respective order; a semiconductor element fixed to the circuit plate; a wiring member having a printed circuit board and a plurality of conductive posts; external terminals connected electrically and mechanically to the circuit plate; and an insulating sealing material. The bus bar unit includes a plurality of bus bars mutually connecting the external terminals of the plurality of power semiconductor units.

15 Claims, 12 Drawing Sheets

(51) Int. Cl.
*H01L 23/528* (2006.01)
*H01L 23/473* (2006.01)
*H01L 25/07* (2006.01)
*H01L 25/18* (2006.01)
*H01L 23/492* (2006.01)
*H01L 23/31* (2006.01)
*H01L 23/373* (2006.01)
*H01L 23/40* (2006.01)
*H01L 23/498* (2006.01)
*H01L 23/538* (2006.01)

(52) U.S. Cl.
CPC ........ *H01L 23/4006* (2013.01); *H01L 23/492* (2013.01); *H01L 23/49811* (2013.01); *H01L 23/5286* (2013.01); *H01L 23/5385* (2013.01); *H01L 24/49* (2013.01); *H01L 25/07* (2013.01); *H01L 25/072* (2013.01); *H01L 25/18* (2013.01); *H01L 29/1608* (2013.01); *H01L 2224/32225* (2013.01); *H01L 2224/48091* (2013.01); *H01L 2224/48137* (2013.01); *H01L 2224/48227* (2013.01); *H01L 2224/48247* (2013.01); *H01L 2224/73265* (2013.01); *H01L 2924/00014* (2013.01); *H01L 2924/181* (2013.01)

(56) References Cited

U.S. PATENT DOCUMENTS

2013/0176761 A1* 7/2013 Hattori et al. .......... B60L 11/14
 363/131
2014/0124915 A1* 5/2014 Hayashi .................. H01L 24/49
 257/713

FOREIGN PATENT DOCUMENTS

| JP | 2007-273884 A | 10/2007 |
| JP | 2008-206363 A | 9/2008 |
| JP | 2011-209158 A | 10/2011 |
| JP | 2012-119618 A | 6/2012 |
| JP | 5241177 B2 | 7/2013 |
| JP | 2013-191806 A | 9/2013 |

OTHER PUBLICATIONS

China Patent Office, "Office Action for Chinese Patent Application No. 201580008212.7," dated Jan. 29, 2018.

* cited by examiner

Fig. 8(a)    Fig. 8(b)    Fig. 8(c)

POWER SEMICONDUCTOR MODULE

CROSS-REFERENCE TO RELATED APPLICATION

This is a continuation application of PCT International Application No. PCT/JP2015/071203 filed on Jul. 27, 2015, which claims a priority of Japanese Patent Application No. 2014-174629 filed on Aug. 28, 2014, the disclosure of which is incorporated herein.

TECHNICAL FIELD

The present invention relates to a power semiconductor module that is suitable for automotive application, industrial fields use, and the like.

BACKGROUND ART

Conventional power semiconductor modules include respective types such as 1-in-1 having one switching element, 2-in-1 having two switching elements, and 6-in-1 having six switching elements, with outside shapes different from one another. Further, the power semiconductor modules have various ratings in current and voltage different from one another as required from customers. Therefore, products have been designed and manufactured separately in response to the ratings in current and voltage.

FIG. 12 illustrates a sectional view of an example of the conventional power semiconductor module. A multilayered substrate 121 is provided on a fin-base 111 of a cooler 110 in a power semiconductor module 101. The multilayered substrate 121 has a multilayered structure in which a circuit plate 121b is fixed to the front face of an insulating plate 121a, and a metal plate 121c to the rear face of the insulating plate 121a. The multilayered substrate 121 is fixed to the fin-base 111 with joining material 122 such as solder. On the circuit plate 121b, a semiconductor chip 123 is joined with conductive joining material 124 such as solder.

A case 125, which is provided to a circumference of the multilayered substrate 121, accommodates the multilayered substrate 121 and the semiconductor chip 123. A cover 125a is disposed on the upper end of the case 125. An external terminal 126, wherein one end is exposed inside the case 125 and the other end is protruding from the upper end of the case 125, is integrally connected to the case 125. Connections between the semiconductor chips 123 and also between the semiconductor chip 123 and the external terminal 126 are achieved electrically through bonding wires 127. An empty space inside the case 125 is sealed, for example, with sealing material 128 composed of insulating resin in order to insulate the multilayered substrate 121, the semiconductor chip 123, and the bonding wires 127 from one another. A metal ring 129 is mounted to a through-hole disposed to the end part of the case 125 as a way to connect the case 125. Then a screw 130 is provided through the metal ring 129, and then the screw 130 is screwed down to connect the fin-base 111. Moreover, the fin-base 111 is adhered to the bottom face of the case 125 through adhesive 131.

The cooler 110 comprises the fin-base 111, a fin 112 connected to the fin-base 111, and a case 113 that accommodates the fin 112 and is hermetically sealed at the peripheral edge of the fin-base 111. A channel is formed inside the case 113. Feeding coolant to the channel allows heat generated from the semiconductor 123 and then conducted to the fin 112 through the multilayered substrate 121 to cool down.

With regard to conventional power semiconductor modules, products are designed and then manufactured separately corresponding to, for example, the number of semiconductor chips and ratings in current and voltage. Then it takes much expense in time and effort to design and then to manufacture them. Furthermore, it is required for the power semiconductor module to slim down in size and thickness for the sake of automotive application and the like.

Relating to miniaturization of the power semiconductor module, it is provided that a device includes a laminate bus bar on which a semiconductor module and a cooler are connected to the both faces (Patent Literature 1). However, with regard to the power semiconductor module described in Patent Literature 1, as bonding wires are employed in the respective semiconductor modules, it takes much expense in time and effort during manufacturing. Further the outside shape including the cooler is not slimmed down sufficiently because the semiconductor module and the cooler are provided on both faces, respectively.

CITATION LIST

Patent Literature

Patent Literature 1: Japanese Patent Application Laid-open No. 2007-273884

DISCLOSURE OF INVENTION

Problem to be Solved by the Invention

The present invention can solve the problems described above advantageously. It is an object of the present invention to provide a power semiconductor module that is manufactured speedily at low cost while reducing expense in time and effort as well as slimming down in thickness when multiple kinds of power semiconductor modules are fabricated corresponding to ratings in current and voltage and also a circuit configuration.

Means for Solving Problems

There is provided, according to an aspect of the present invention, a power semiconductor module comprising a cooler; a plurality of power semiconductor units that is fixed side by side on the cooler; and a bus bar unit connected electrically to the plurality of power semiconductor units. Each of the plurality of power semiconductor units includes a multilayered substrate in which a circuit plate, an insulating plate, and a metal plate are laminated in order; a semiconductor element in which the front face has an electrode, and the rear face is fixed to the circuit plate; a wiring member having a printed circuit board and a plurality of conductive posts, wherein the printed circuit board is disposed facing the front face of the semiconductor element and to the circuit plate, and one end of the conductive post is connected electrically and mechanically to the printed circuit board, and the other end thereof is also connected electrically and mechanically to the electrode of the semiconductor element or to the circuit plate; an external terminal that is connected electrically and mechanically to the circuit plate; and an insulating sealing material that seals the multilayered substrate, the semiconductor element, the wiring member, and the external terminal. The bus bar unit includes a plurality of bus bars that mutually connects the external terminals of the respective power semiconductor units.

Effect of the Invention

According to the power semiconductor module of the present invention, when multiple kinds of power semiconductor modules are manufactured, it is possible to reduce expense in time and effort upon manufacturing and to fabricate them speedily at a low cost while slimming down in thickness.

MODES FOR CARRYING OUT THE INVENTION

Hereinafter, preferred embodiments of a power semiconductor module according to the present invention will be described concretely with reference to the accompanying drawings. In addition, the use of the term "connected electrically and mechanically to" in the description according to the present application is not limited to a case that objects concerned are connected by direct joining with each other and also includes a case that the objects are connected with each other through conductive joining material such as solder or sintered metal material.

First Embodiment

Figure 1:
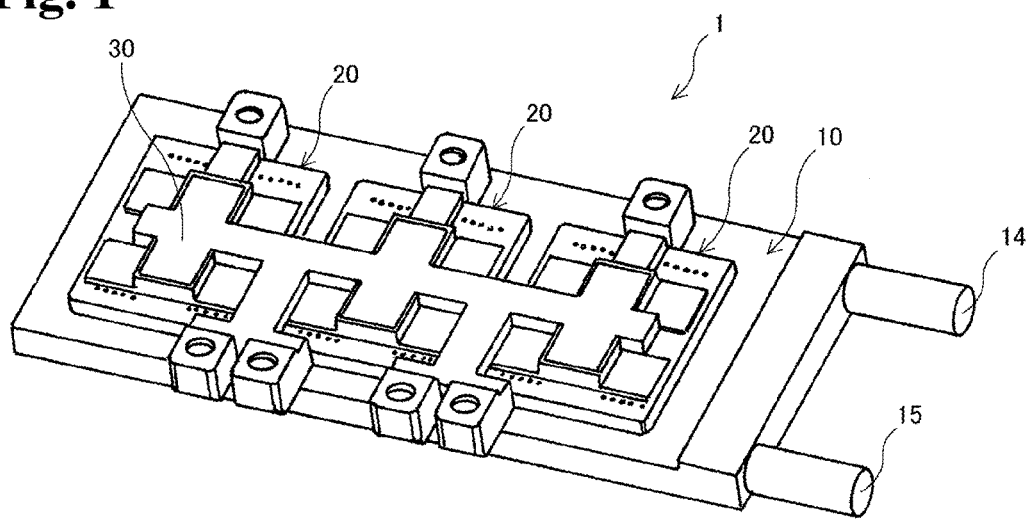
FIG. 1 is a perspective view of a power semiconductor module according to one embodiment of the present invention.
Figure 2:
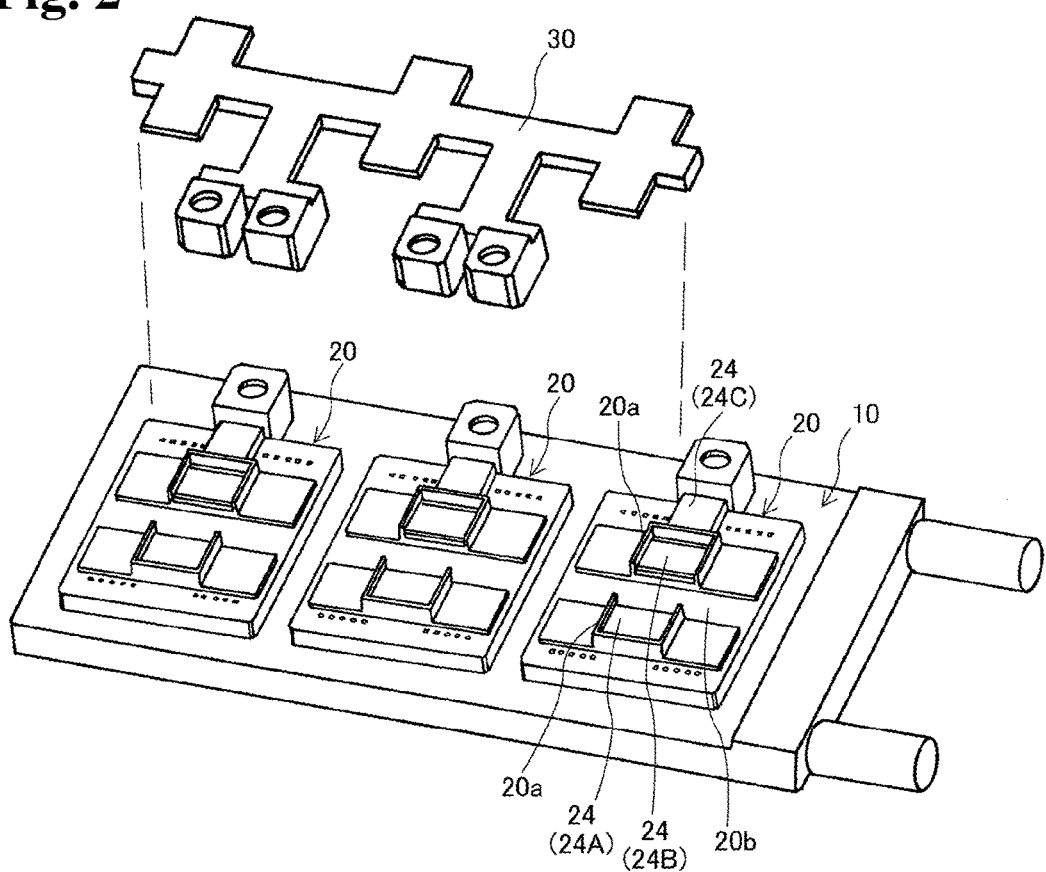
FIG. 2 is a disassembled perspective view of the power semiconductor module illustrated in FIG. 1.

FIG. 1 shows a perspective view of a power semiconductor module according to one embodiment of the present invention. FIG. 2 shows a disassembled perspective view of the power semiconductor module illustrated in FIG. 1. A power semiconductor module 1 according to the first embodiment of the present invention includes a cooler 10, a plurality of power semiconductor units 20, and a bus bar unit 30. The plurality of power semiconductor units 20 is disposed on the cooler 10 side by side, and the respective power semiconductor units 20 are connected electrically using the bus bar unit 30.

The cooler 10 includes an inlet 14 and an outlet 15 for flowing coolant and is connected to a cooling system not shown. Then the coolant is introduced in the cooler 10 via the inlet 14 and discharged from the outlet 15. An inside structure of the cooler 10 will be described later.

Figure 3:
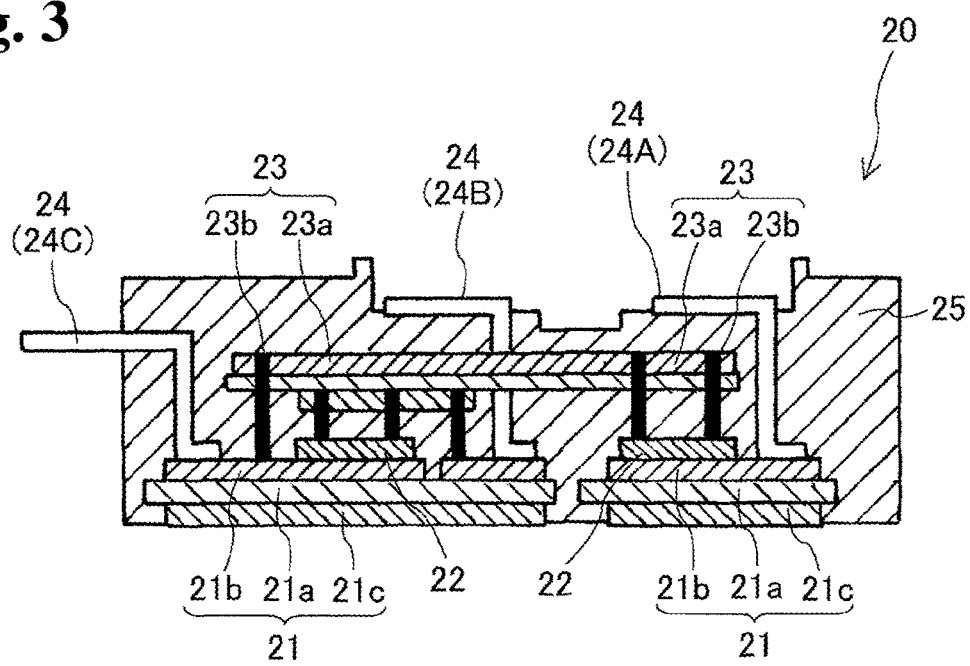
FIG. 3 is a cross-sectional view of a power semiconductor unit.

FIG. 3 shows a cross-sectional view of the power semiconductor unit 20. The power semiconductor unit 20 is so-called 2-in-1, having a circuit in which an upper arm and a lower arm are configured so that a switching element is connected with a wheeling diode in reverse parallel manner. The power semiconductor unit 20 includes a multilayered substrate 21, semiconductor chips 22, a wiring member 23, external terminals 24, and sealing material 25.

The multilayered substrate 21 is configured so as to have an insulating plate 21a, a circuit plate 21b that is provided on the front face of the insulating plate 21a, a metal plate 21c that is provided on the rear face of the insulating plate 21a. Namely, the circuit plate 21b, the insulating plate 21a, and the metal plate 21c are laminated in order to form it. The insulating plate 21a is composed of, for example, insulating ceramics such as aluminum nitride, silicon nitride, and aluminum oxide. Each of the circuit plate 21b and the metal plate 21c is formed of, for example, a metal like copper or the like. Then a predetermined circuit pattern is formed in the circuit plate 21b. For example, a direct copper bonding (DCB) substrate or an active metal blazing (AMB) substrate can be employed for the multilayered substrate 21.

An electrode, not shown, is disposed on the front face of the semiconductor chip 22, and the rear face thereof fixed to the circuit plate 21b through joining material such as solder not shown. According to the present embodiment of the present invention, the semiconductor chip 22 is a vertical semiconductor chip in which the respective electrodes are provided on both the front face and the rear face. Then the electrode formed on the rear face is connected electrically and mechanically to the circuit plate 21b. However, the semiconductor chip 22 is not limited to the vertical one. It may be a lateral semiconductor chip in which plural kinds of electrodes are provided on the front face of the semiconductor chip 22.

The semiconductor chip is, for example, a power-MOSFET, a diode, or an insulating gate bipolar transistor (IGBT). The semiconductor chip may be formed of a silicon semiconductor or of a silicon-carbide (SiC) semiconductor. When the semiconductor chip 22 is the IGBT, a collector electrode is disposed on the rear face, and an emitter electrode and a gate electrode on the front face. When the semiconductor chip 22 is the power-MOSFET, a drain electrode is disposed on the rear face, and a source electrode and a gate electrode are disposed on the front face. The semiconductor chip formed of SiC (for example, a SiC-MOSFET) has a higher withstand voltage and can switch with a higher frequency than that formed of silicon. Then it is suitable optimally as the semiconductor chip 22 of the power semiconductor module according to the present embodiment. However, the semiconductor chips 22 are not limited to the IGBT or the power-MOSFET and may be configured using one or a combination of more than one semiconductor element that has a function of switching operation.

The wiring member 23 includes a printed circuit board 23a and a plurality of conductive posts 23b. The printed circuit board 23a, having a metal layer and an insulating layer, is disposed facing the front face electrode of the semiconductor chip 22 and the circuit plate 21b of the multilayered substrate 21. One end of conductive post 23b is connected electrically and mechanically to the front face electrode of the semiconductor chip 22 or to the circuit plate 21b of the multilayered substrate 21 by soldering or brazing. Then the other end thereof is connected electrically and mechanically to the metal layer of the printed circuit board 23a by soldering, brazing, or swaging.

For example, the front face electrode of the semiconductor chip 22 can be connected electrically to the circuit plate 21b through the wiring member 23. According to the present embodiment, the wiring member 23 is not formed by using bonding wires but configured so as to have the printed circuit board 23a and the conductive posts 23b. This allows the power semiconductor unit to obtain excellent reliability against thermal cycling depending upon heat generated repeatedly from the semiconductor chip 22. Further as the wiring member 23 is configured so as to have the printed circuit board 23a and the conductive posts 23b, this allows the power semiconductor unit 20 to reduce in thickness when compared with the case of using the bonding wire. Moreover, the conductive post 23b can be connected securely as compared with the bonding wire even when the front face electrode has a smaller area. Furthermore, when comparing with a lead, the conductive post serves excellent reliability because of smaller stress applied on the semiconductor chip 22 and is advantageous to conduct electrically and thermally because of reducing the joining material in thickness.

When the semiconductor chip 22 is the switching element, it is preferable that the printed circuit board 23a is configured to have a plurality of metal layers corresponding to the gate electrode and the source electrode disposed on the front face of the chip. The metal layer of the printed circuit board 23a and the conductive post 23b are composed of a metal having excellent conductivity such as copper. Further a surface of the printed circuit board 23a and the conductive post 23b can be plated as required. An insulating layer of the printed circuit board 23a may be a rigid board composed of, for example, glass-epoxy material. Moreover the insulating layer may be a flexible board composed of, for example, poly-imide material. In addition, the insulating layer may be a board composed of ceramics. An outside shape of the conductive post 23b can be shaped, for example, like a cylindrical column and a cuboid. Nevertheless, it not limited to those. The bottom face of the conductive post 23b is smaller in size than the front face electrode of the semiconductor chip 22. In addition, any number of conductive posts 23b can be set up to one semiconductor chip 22. Then even two or more conductive posts 23b can be joined to one front face electrode.

When the power semiconductor unit 20 is assembled, the printed circuit board 23a and the conductive posts 23b can be integrated in advance to form the wiring member 23. The use of the wiring member 23 allows the manufacturing process of the semiconductor unit 20 to become simple in comparison with the case using the bonding wire.

One end of the external terminal 24 is connected electrically and mechanically to the circuit plate 21b of the multilayered substrate 21. It is preferable that the external terminal 24 is configured of the lead composed of a copper plate or the like in order to flow a large current. The circuit plate 21b can be connected to the external terminal 24, for example, by using joining material such as solder, not shown, or by using a method such as an ultrasonic joining.

The other end of the external terminal 24 is bent so as to be in parallel to the bottom face of the power semiconductor unit 20. As shown in FIG. 3, for example, a P terminal 24A, an N terminal 24B, and a U terminal (or a V terminal or a W terminal) 24C are provided as the external terminals 24.

In the power semiconductor unit 20, the respective members, including the multilayered substrate 21, the semiconductor chip 22, the wiring member 23, and the external terminal 24, are sealed with sealing material 25 composed of insulating thermosetting resin. In addition, the bottom face of the metal plate 21c in the multilayered substrate 21 and the other end of the external terminal 24 are exposed outwardly from the sealing material 25. The sealing material composed of the thermosetting resin is preferable to use as the sealing material 25 because of having higher heat resistance and withstand voltage properties when compared with another sealing material composed of gel. Concretely, epoxy-resin can be employed as the sealing material 25. Further, in order to increase heat radiation properties, the sealing material is preferably prepared so that filler with high thermal conductivity is added into the resin. Alumina or boron nitride, for example, can be applied as the filler.

An outside shape of the power semiconductor unit 20 is formed so as to be molded with the sealing material 25. According to the present embodiment, a housing of the power semiconductor unit 20 is constituted of the sealing material 25. Then there is no case provided separately. A transfer mold method can be employed for molding, but is not a unique solution. A resin potting method, for example, can be also available to mold. Moreover, the power semiconductor unit 20 can be also formed by providing a case separately.

Figure 4:
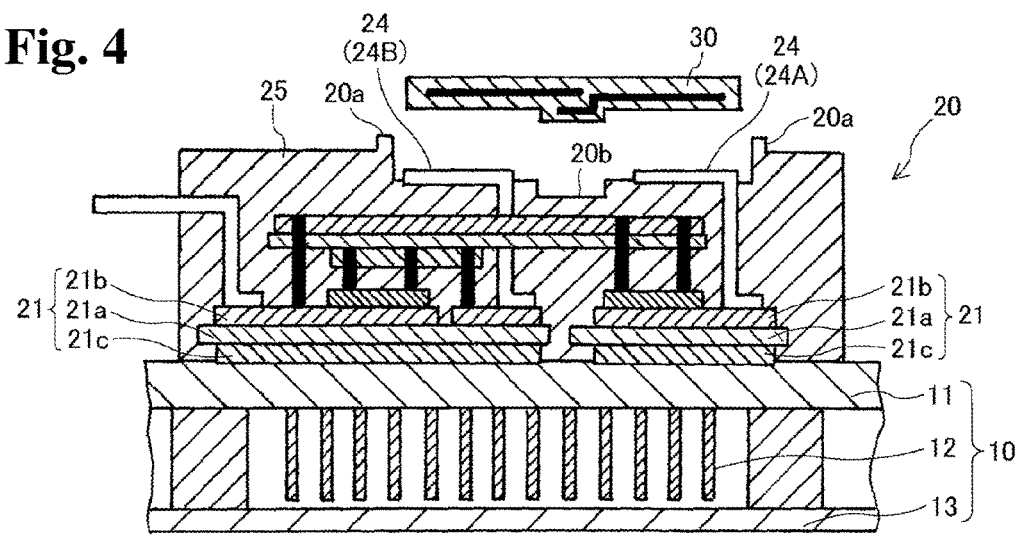
FIG. 4 is a cross-sectional view illustrating the power semiconductor unit, a cooler, and a bus bar unit.

FIG. 4 illustrates a cross sectional view of the power semiconductor unit 20, the cooler 10, and the bus bar unit 30. The metal plate 21c in the power semiconductor unit 20 is fixed to a fin-base 11 of the cooler 10 with joining material such as solder not shown. Further the bottom face part of the sealing material 25 of the power semiconductor unit 20 is fixed to the fin-base 11 of the cooler 10 with adhesive not shown. In addition, the method for fixing the power semiconductor unit 20 to the cooler 10 is not limited to the joining material and the adhesive described above. For example, heat-dissipative material such as thermal-grease can be coated between the metal plate 21c and the fin-base 11, and then a screw may be screwed down via a through-hole, which is disposed separately to the power semiconductor unit, to fix the power semiconductor unit to the fin-base 11. In terms of heat-radiation properties, it is preferable to be fixed with the joining material and the adhesive. In terms of manufacturing cost, on the other hand, it is preferable to be fixed by being screwing down.

The cooler 10 includes the fin-base 11, a fin 12 that is integrally connected to the fin-base 11, and a case 13 that accommodates the fin 12 and is disposed on the peripheral edge of the fin-base 11. A channel is configured in the case 13. Then flowing coolant into the channel allows heat generated in the semiconductor chip 22 and conducted to the fin 12 through the multilayered substrate 21 to radiate. As the power semiconductor module 1 includes the cooler 10, the semiconductor chip 22 can be cooled down sufficiently even though the power semiconductor unit 20 is slimmed down. That is, it is possible to slim down the power semiconductor 20. Then, flexibility for finding a place to install the power semiconductor module will increase in regard to, for example, automotive application having only a tight space to dispose it. Furthermore, according to the power semiconductor module 1 of the present invention, it can be employed by mounting in a manner of not only laterally but also vertically.

The P terminal 24A and the N terminal 24B, which are the external terminals 24, are exposed to the upper side of the power semiconductor unit 20. The P terminal 24A and the N terminal 24B are connected electrically to each of the bus bars of the bus bar unit 30. In order to set up the bus bar unit 30 easily, a protrusion 20a and a groove 20b are provided on the upper side of the power semiconductor unit 20.

Figure 5:
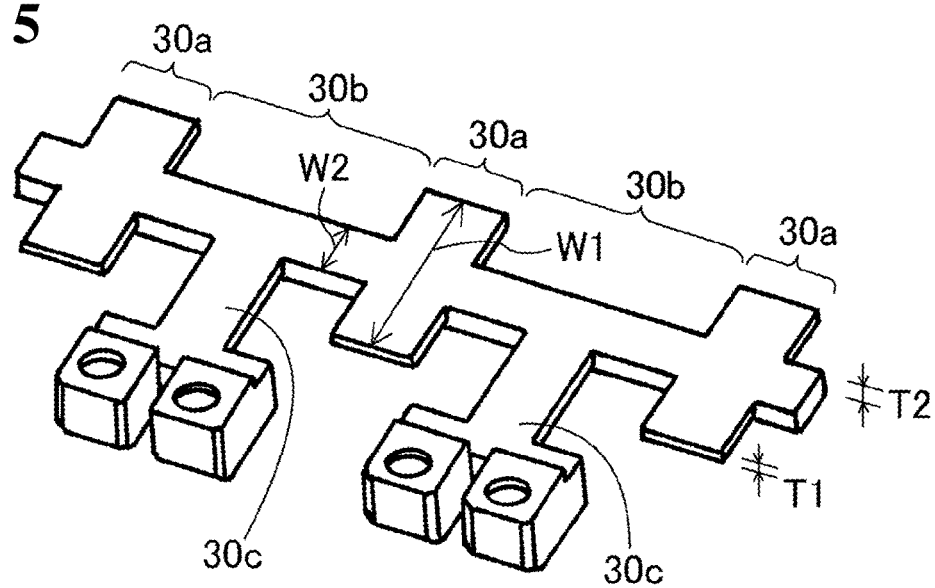
FIG. 5 is a perspective view of the bus bar unit.

The bus bar unit 30 is configured so that the P terminals 24A and the N terminals 24B of the plurality of power semiconductor units 20 are connected electrically to form a common P terminal and another common N terminal, respectively. FIG. 5 shows a perspective view of the bus bar unit 30. The bus bar unit 30, illustrated in FIG. 5, can configure the 6-in-1 power semiconductor module 1 so that three 2-in-1 power semiconductor units 20 are connected electrically mutually.

The bus bar unit 30 includes therein two bus bars. The two bus bars are respectively connected to the P terminals 24A and the N terminals 24B of the respective power semiconductor units 20, and extend to the common P terminal or N terminal. Then the outside shape shown in the figure is formed when molded with insulating resin. As the bus bar is molded so as to be covered with the resin, the two bus bars are held with a predetermined distance and insulated surely from each other. In addition, this can prevent the bus bar from corroding.

The bus bar unit 30 is integrally formed to have a terminal connector 30a, a coupler 30b, and a terminal base 30c. Each of the terminal connectors 30a is connected to each of the P terminals 24A and the N terminals 24B of the respective power semiconductor units 20. Each of the couplers 30b couples the respective terminal connectors. A common terminal of the power semiconductor module 1 is provided to the terminal base 30c.

In the terminal connector 30a, one bus bar in the bus bar unit 30 is fixed with the P terminal 24A or the N terminal 24B of the power semiconductor unit 20 by using such a way as screwing, bolt connection, solder joining, laser welding, or the like. Then the P terminal 24A or the N terminal 24B of the power semiconductor unit 20 is connected electrically to the one bus bar in the bus bar unit 30. In order to be connected electrically to the terminals of the power semiconductor unit 20, the built-in bus bars are exposed on the rear face of the terminal connector 30a of the bus bar unit 30. Further, when using screwing, bolt connection, or laser welding, an aperture may be formed on the front face of the terminal connector 30a to expose the bus bar.

As shown in FIG. 5, the bus bar unit 30 has a narrower width W2 of the coupler 30b when compared with a width W1 of the terminal connector 30a. A space is created between the terminal connectors 30a and can be used for disposing parts connected to a control board (see FIG. 11) provided in a stacked manner on the power semiconductor module 1. Therefore, stacking the control board on the power semiconductor module 1 allows the height after stacked to decrease. So, this permits the whole power semiconductor module to decrease in thickness even when the control board is required to be installed in the power semiconductor module 1.

The bus bar unit 30 has a flat upper face. The reason comes from that physical interference to the control board and electronic parts connected on the flat upper face can be avoided as much as possible when the control board is required to install on the bus bar unit 30. This contributes to reduced thickness as a whole of the power semiconductor module to which the control board is connected. The bus bar unit 30 has a larger thickness T2 in the coupler 30b when compared with a thickness T1 in the terminal connector 30a. This reason is that two sheets of bus bars are built in the coupler 30b in a stacked manner while on the contrary one sheet of bus bar is built in the terminal connector 30a. As the two sheets of bus bars, in which the polarities are different to each other, are built in a stacked manner in the coupler 30b, this allows wiring using the bus bars to become reduced inductance.

Figure 6:
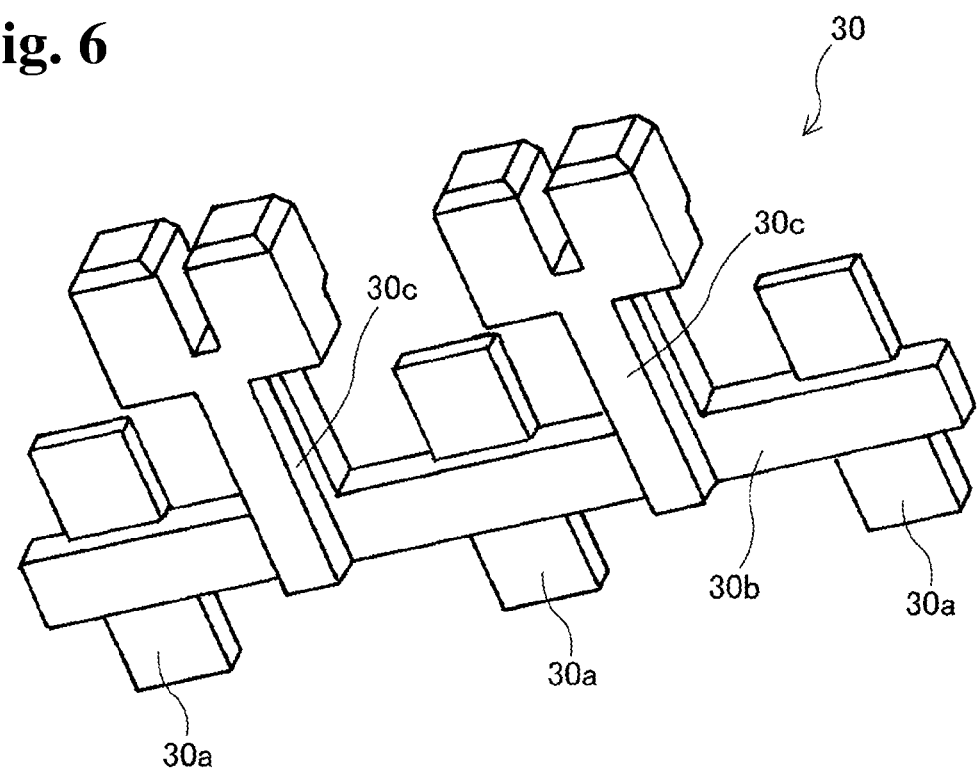
FIG. 6 is another perspective view illustrating the bus bar unit when viewed from a lower side.

FIG. 6 shows another perspective view of the bus bar unit 30 when observed from a lower side. The coupler 30b protrudes downward in the bus bar unit 30. The coupler 30b is engaged with the groove 20b provided on the upper side of the power semiconductor unit 20. Furthermore, the terminal connector 30a is engaged with the protrusion 20a provided on the upper side of the power semiconductor unit 20. Then, the bus bar unit 30 can be installed readily to the power semiconductor unit 20 so that the coupler 30b of the bus bar unit 30 is aligned to the groove 20b of the power semiconductor unit 20, and the terminal connector 30a is matched to the protrusion 20a.

The p terminal and the N terminal, which are connected to the outside, are provided in the terminal base 30c of the bus bar unit 30. As shown in FIGS. 5 and 6, two terminal bases 30c are provided to one bus bar unit 30, respectively. This aims to avoid current from concentrating in one terminal base 30c. When the two terminal bases 30c are provided, a current is divided into two parts in the P terminals as well as in the N terminals of the terminal bases 30c. However, the number of terminal bases 30c may be one or may be three or more.

Figure 7:
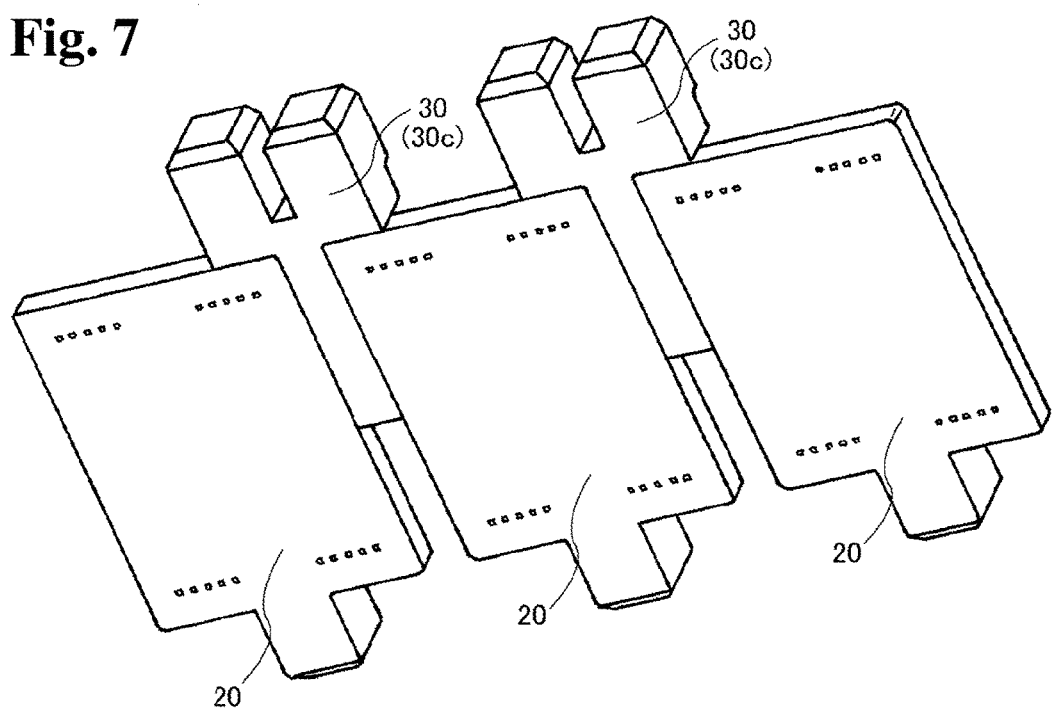
FIG. 7 is a perspective view illustrating the power semiconductor units and the bus bar unit when viewed from a lower side.

FIG. 7 shows a perspective view of a configuration having a combination of the power semiconductor units 20 and the bus bar unit 30 when viewed from a lower side. As shown in FIG. 7, it is preferable that the terminal base 30c of the bus bar unit 30 is provided so as to be positioned between the power semiconductor units 20 that are adjacent to each other. Then the terminal base 30c can be disposed to be lower in position. Thus this allows the power semiconductor module 1 to decrease in thickness.

Figure 8:
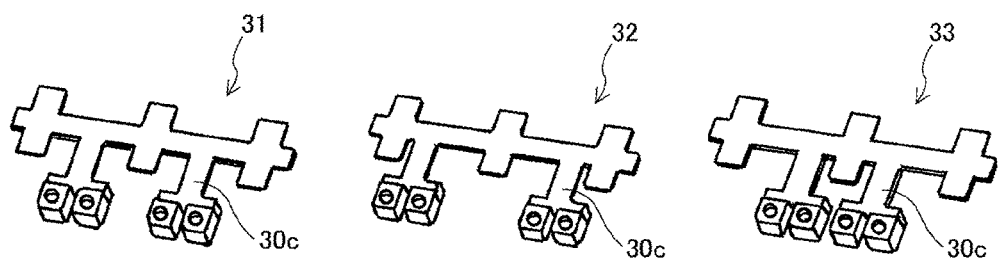
FIGS. 8(a), 8(b), and 8(c) are perspective views illustrating instances of the bus bar units.

FIGS. 8(a) to 8(c) show perspective views of instances of bus bar units 31 to 33 in which each distance between two terminal bases 30c is different from one another. FIGS. 8(a), 8(b), and 8(c) show the bus bar unit 31 having the standard distance, the bus bar unit 32 having a wider distance when compared with the standard one, and the bus bar unit 33 having a narrower distance when compared with the standard one, respectively. As shown above, with regard to the terminal base 30c in the bus bar unit, it is available to select any shape, any position, any number, and the like. Then the P terminal and the N terminal of the power semiconductor module 1 can be changed flexibly just by altering the bus bar unit 30.

The power semiconductor module 1 according to the present embodiment is configured so that three pieces of 2-in-1 power semiconductor units 20 having the same shape and ratings as one another, disposed side by side on the cooler 10 and connected electrically using the bus bar unit 30, form one piece of 6-in-1 power semiconductor module. Then this can avoid taking effort and time in designing and manufacturing when compared with the case that the 2-in-1 and the 6-in-1 power semiconductor modules are separately designed and manufactured. Thus various kinds of power semiconductor modules can be manufactured speedily and at a low cost.

The 6-in-1 power semiconductor module described above is an example according to the present invention. With regard to another example, another power semiconductor module having three pieces of 2-in-1 units connected in parallel to one another can be manufactured by employing another bus bar unit 30 with which three pieces of the power semiconductor units 20 are connected electrically in parallel. As described above, even in the case that three pieces of the power semiconductor units 20 are combined with the cooler 10, different types of the power semiconductor modules can be manufactured just by changing the bus bar unit 30.

Second Embodiment

Figure 9:
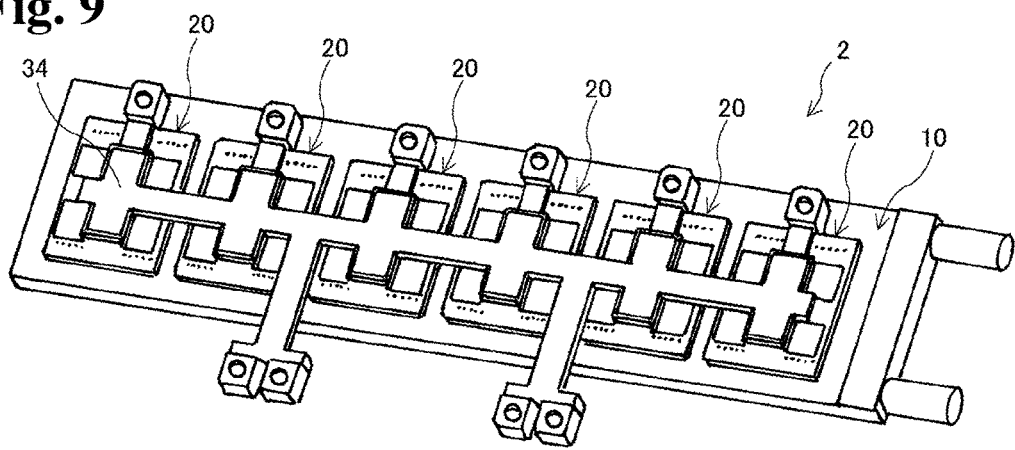
FIG. 9 is a perspective view of another power semiconductor module according to another embodiment.

FIG. 9 shows a perspective view of a power semiconductor module 2 according to another embodiment. In addition, according to the embodiment described hereinafter, the same references are attached to the same members as the power semiconductor module 1 according to the first embodiment. Then redundant description is omitted about the respective members described hereinafter.

The power semiconductor module 2 is formed so that six species of the power semiconductor units 20 being the same type to one another, provided on the cooler 10, are connected electrically using a bus bar unit 34. The bus bar unit 34 is configured so that the six pieces of the power semiconductor units 20 can be connected electrically in parallel to one another. With the use of the 2-in-1 power semiconductor units 20 described above, a power semiconductor module that six pieces of the 2-in-1 units are connected in parallel can be configured just by changing an already-existing bus bar unit to the bus bar unit 34 having a length corresponding to the number of power semiconductor units 20 while modifying only the length of the cooler 10.

As understood based on FIGS. 1 and 9, according to the embodiment of the present invention, various kinds of power semiconductor modules can be manufactured by changing the number of power semiconductor units 20 and the configuration of the bus bar unit 30. Consequently, power semiconductor modules responding to customer needs flexibly can be manufactured at a low cost as well as swiftly.

Third Embodiment

Still another power semiconductor module according to still another embodiment will be explained.

According to the present embodiment, another bus bar unit 30 builds electronic components like capacitor and the like in the terminal base 30c or in the other places. The electronic components are covered with insulating resin in conjunction with the bus bar when manufacturing the bus bar unit 30.

As the electronic components are built in the bus bar unit 30, it is possible that a part or the whole of the electronic components that have been connected to the control board in conventional arts can be provided to the bus bar unit 30. Then this allows the power semiconductor module 1 to have also apart or the whole of the function with which the control board is equipped.

Fourth Embodiment

Figure 10:
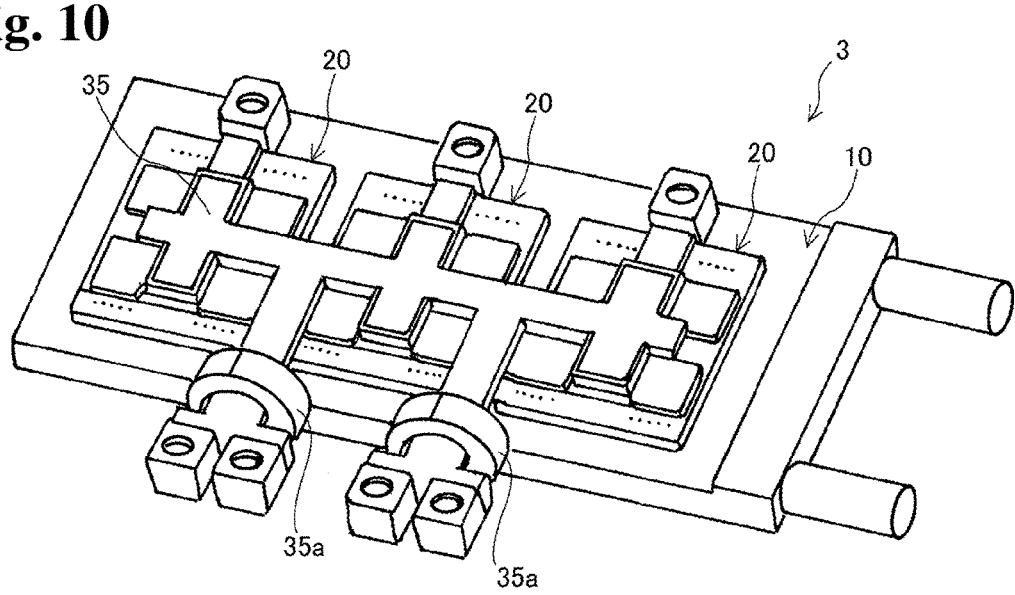
FIG. 10 is a perspective view of still another power semiconductor module according to still another embodiment.

FIG. 10 shows a perspective view of the power semiconductor module according to still another embodiment.

In a power semiconductor module 3 shown in FIG. 10, a bus bar unit 35 is equipped with a sensor. More concretely, a current sensor 35a is connected to the terminal base 30c of the bus bar unit 35. That is, when an already-existing bus bar unit of the power semiconductor module 3 is replaced to the bus bar unit 35, the power semiconductor module 3 can determine a current by itself. As described above, according to the present embodiment, supplementary functions can be added to the power semiconductor module.

A sensor added is not limited to the current sensor 35a shown in FIG. 10. Then a temperature sensor such as a thermistor can be provided to the bus bar unit 30 as a sensor. The temperature sensor can be set up at any place. Nevertheless, it may be connected to a similar place to the current sensor 35a.

Fifth Embodiment

Figure 11:
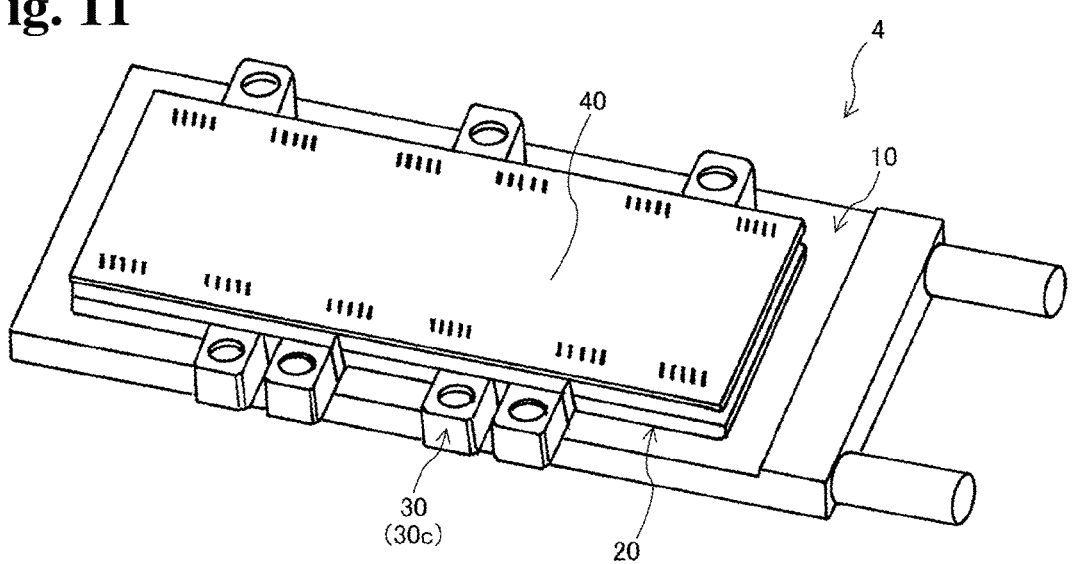
FIG. 11 is a perspective view of still another power semiconductor module according to still another embodiment.
Figure 12:
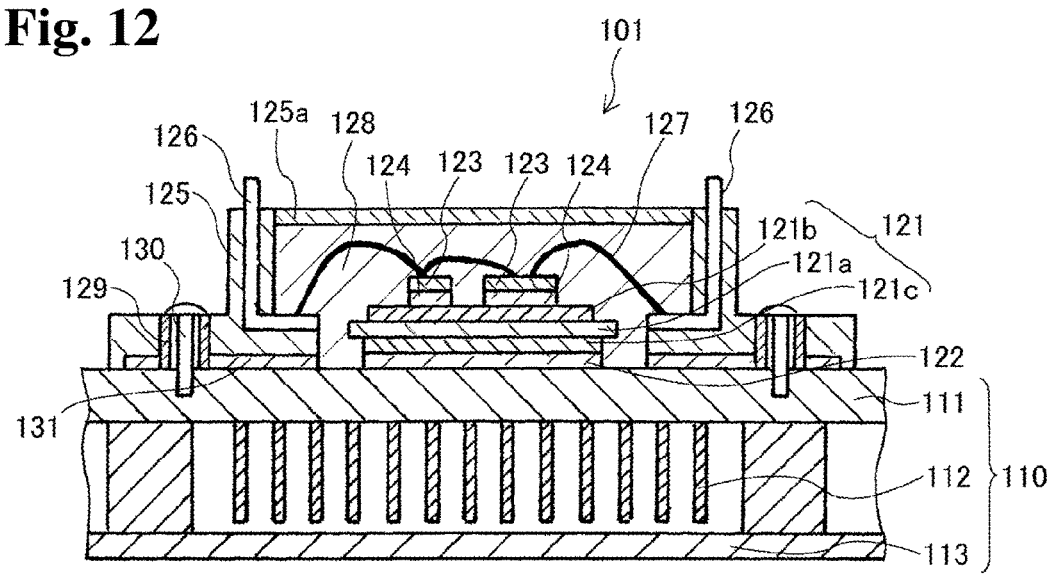
FIG. 12 is a cross-sectional view of a conventional power semiconductor module.

FIG. 11 shows a perspective view of still another power semiconductor module according to still another embodiment.

In a power semiconductor module 4 according to the present embodiment, a control board 40 is provided on the bus bar unit 30. Electronic components connected to the control board 40 can be disposed to a space between the terminal connectors 30a adjacent to each other in the bus bar unit 30 as described earlier. Then it is preferable to reduce in thickness in the power semiconductor module in its entirety.

The control board 40 can be employed irrespective of types and application purposes. For example, when the control board 40 is connected electrically to a control terminal, not shown, of the power semiconductor unit 20, the power semiconductor module 4 comes into use as an intelligent power module (IPM). This enables the module to obtain a higher level control.

Sixth Embodiment

As still another embodiment of the power semiconductor module, there can also be a configuration that each of the power semiconductor units 20 and each of the bus bar units 30 are fixed to the both faces of the cooler 10, respectively. The power semiconductor module according to the present invention is formed to be a thin type in thickness, and has a sufficiently thin outside shape even though each of the power semiconductor units 20 and each of the bus bar units 30 are fixed to the both faces of the cooler 10, respectively.

The power semiconductor module according to the present invention has been concretely described above by using figures and embodiments. However, the power semiconductor module according to the present invention is not limited to the above described figures and embodiments and changeable variously within the scope being not deviated from the gist thereof of the present invention.

EXPLANATIONS OF LETTERS OR NUMERALS

1, 2, 3, 4: power semiconductor module
10: cooler
20: power semiconductor unit
20a: protrusion
20b: groove
21: multilayered substrate
21a: insulating plate
21b: circuit plate
21c: metal plate
22: semiconductor chip
23: wiring member
23a: printed circuit board
23b: conductive post
24: external terminal
25: sealing material
30, 31, 32, 33, 34, 35: bus bar unit 30a: terminal connector
30b: coupler
30c: terminal base
35a: current sensor
40: control board

What is claimed is:

1. A power semiconductor module comprising:
a cooler;
a plurality of power semiconductor units fixed side by side on the cooler; and
a bus bar unit electrically connecting the plurality of power semiconductor units,
wherein each of the plurality of power semiconductor units includes
a multilayered substrate having a circuit plate, an insulating plate, and a metal plate laminated in respective sequence,
a semiconductor element having a front face including an electrode, and a rear face fixed to the circuit plate,
a wiring member having a printed circuit board and a plurality of conductive posts, wherein the printed circuit board is disposed facing the front face of the semiconductor element and the circuit plate, one end of each of the plurality of conductive posts is connected electrically and mechanically to the printed circuit board, and another end of each of the plurality of conductive posts is connected electrically and mechanically to the electrode of the semiconductor element or to the circuit plate,
external terminals connected electrically and mechanically to the circuit plate, and
an insulating sealing material sealing the multilayered substrate, the semiconductor element, the wiring member, and the external terminals,
the bus bar unit includes a plurality of bus bars mutually connecting the external terminals of the plurality of power semiconductor units,
the plurality of bus bars is covered by an insulating resin such that the bus bar unit is integrally formed as one unit with the plurality of bus bars,
the bus bar unit includes two sheets of bus bars held with a predetermined distance,
the bus bar unit includes, as one member, terminal connectors each being connected to each of respective terminals of the respective power semiconductor units, couplers, and terminal bases, each coupler coupling the respective terminal connectors and terminal bases, and
the plurality of bus bars is disposed above the semiconductor element.

2. The power semiconductor module according to claim 1, wherein
the coupler has a width narrower than that of the terminal connector.

3. The power semiconductor module according to claim 1, further comprising a control board provided on the bus bar unit.

4. The power semiconductor module according to claim 2, wherein the bus bar unit has a flat upper face, and the coupler protrudes downward, and
each of the plurality of power semiconductor units has a groove on an upper side to engage the coupler.

5. The power semiconductor module according to claim 2, wherein the terminal base of the bus bar unit is disposed between the plurality of power semiconductor units adjacent to each other.

6. The power semiconductor module according to claim 1, wherein the bus bar unit further includes a sensor.

7. The power semiconductor module according to claim 1, wherein the bus bar unit further includes an electronic component.

8. The power semiconductor module according to claim 1, wherein each of the external terminals of the plurality of power semiconductor units includes a lead.

9. The power semiconductor module according to claim 1, wherein each of the external terminals of the plurality of power semiconductor units is fixed to the bus bar unit by screw connection, bolt connection, welding, or joining material.

10. The power semiconductor module according to claim 1, wherein each of the metal plate of the plurality of power semiconductor units is fixed to the cooler with joining material.

11. The power semiconductor module according to claim 1, wherein the semiconductor element is formed of a SiC semiconductor element.

12. The power semiconductor module according to claim 1, wherein each of the plurality of power semiconductor units has a plurality of protrusions and a groove between the plurality of protrusions, on an upper side of the each of the plurality of power semiconductor units.

13. The power semiconductor module according to claim 12, wherein the coupler engages the groove, and each of the terminal connectors engages each of the plurality of protrusions.

14. The power semiconductor module according to claim 1, wherein the two sheets of the bus bars are built in in the insulating resin with a predetermined distance spaced from each other in the couplers, and a part of the two sheets of the plurality of bus bars is overlapped with each other.

15. The power semiconductor module according to claim 1, wherein the couplers of the bus bar unit protrude downward, and each of the plurality of power semiconductor units has a groove on an upper side to engage one of the couplers.

* * * * *